(12) United States Patent
Yun et al.

(10) Patent No.: US 6,635,582 B2
(45) Date of Patent: *Oct. 21, 2003

(54) METHOD OF MANUFACTURING SEMICONDUCTOR DEVICE

(75) Inventors: Cheol-ju Yun, Suwon (KR); Young-min Kwon, Suwon (KR); Heung-soo Park, Seoul (KR)

(73) Assignee: Samsung Electronics Co., Ltd., Suwon (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/270,229

(22) Filed: Mar. 15, 1999

(65) Prior Publication Data

US 2001/0041455 A1 Nov. 15, 2001

(30) Foreign Application Priority Data

Mar. 13, 1998 (KR) .............................................. 98-8562

(51) Int. Cl.⁷ ............................................. H01L 21/302
(52) U.S. Cl. ........................ 438/745; 438/725; 510/175
(58) Field of Search ................................. 438/745, 725, 438/751, 754; 510/175, 176

(56) References Cited

U.S. PATENT DOCUMENTS

| | | | | |
|---|---|---|---|---|
| 5,320,707 A | * | 6/1994 | Kanekiyo et al. | 156/665 |
| 5,354,712 A | * | 10/1994 | Ho et al. | 438/643 |
| 5,466,389 A | * | 11/1995 | Ilardi et al. | 252/156 |
| 5,759,751 A | * | 6/1998 | Shimizu et al. | 430/329 |
| 5,795,702 A | * | 8/1998 | Tanabe et al. | 430/331 |
| 5,817,572 A | * | 10/1998 | Chiang et al. | 438/624 |
| 6,077,788 A | * | 6/2000 | Kawasaki et al. | 438/706 |

OTHER PUBLICATIONS

Hawley's "Condensed Chemical Dictionary", thirteen edition, p. 7.*

* cited by examiner

Primary Examiner—Kin-Chan Chen
(74) Attorney, Agent, or Firm—Marger Johnson & McCollom, P.C.

(57) ABSTRACT

A pre-stripping treatment solution for treatment of metal surfaces before stripping photoresist which has been used for patterning a metal layer. Also provided is a method of removing the photoresist, and a method of manufacturing semiconductor devices using the above solution and method. In one aspect of the invention, the photoresist is first ashed. The ashed resultant structure is then treated, prior to stripping of the photoresist, with a pre-stripping treatment solution of an organic acid solution having a carboxyl group is mixed with deionized water at a volume ratio of 1:0 to 1:100.

6 Claims, 4 Drawing Sheets

METHOD OF MANUFACTURING SEMICONDUCTOR DEVICE

BACKGROUND OF THE INVENTION

1. Field of the Invention

The present invention relates to a treatment solution for manufacturing a semiconductor and a method of manufacturing a semiconductor using the same. In particular, the invention relates to a pre-strip treatment step before stripping a patterned photoresist which has been used for forming a metal interconnect layer, and a method of manufacturing a semiconductor device using the above solution and method.

2. Description of the Related Art

In a typical semiconductor manufacturing process, photolithographic processes are used to form features such as interconnects. Photolithographic processes utilize photoresist materials to imprint the patterns required to form interconnects or other features. As part of the manufacturing process, it is necessary to periodically remove photoresist residue, as well as other residues and contaminants such as byproducts from etching reaction, which often accumulate on the sidewalls of a raised feature, and reaction residue from plasma processes.

To achieve faster operating speeds in semiconductor devices, higher levels of the integration, and therefore finer patterning is required. Thus, cleaning processes become more important for example after dry etching using a photoresist to form metal interconnects or a contact hole for connecting metal interconnects to each other.

In a current semiconductor fabrication process, conductive layers are formed of various kinds of metals, metallized materials and alloys. Vias or contacts are formed for interconnecting lower and upper conductive layers. The vias are mainly formed of tungsten (W). For example, a via hole is opened over a lower interconnect and filled with tungsten to connect the lower interconnect to an upper interconnect.

FIGS. 1 through 3 are cross-sectional views illustrating the steps for forming metal interconnects on a semiconductor substrate 10 using a typical method.

Referring to FIG. 1, an interlayer insulating film 14 having a via hole H1 exposing a part of a lower interconnect layer 12 is formed on a semiconductor substrate 10 on which the lower interconnect layer 12 made of aluminum (Al) or aluminum alloys is formed. Then, the via hole H1 is filled with tungsten, thus forming a contact 20. A metal layer 22 made of aluminum or aluminum alloys is deposited over the contact 20.

Referring to FIG. 2, desired photoresist pattern 32 is formed on the metal layer 22 to define an upper interconnect layer which is to be connected to the lower interconnect layer 12 via the contact 20. However, when an overlap margin is insufficient as a result of the integration of a semiconductor device, a photoresist pattern 34 having an incorrect width may result, even though a process for forming the desired photoresist pattern 32 is performed.

FIGS. 3, 4A and 6B illustrates the resultant structure formed by dry etching the metal layer 22 using the photoresist pattern 34. As shown in FIG. 3, after the metal layer 22 is patterned using the photoresist pattern 34, an upper interconnect layer 22a is obtained, and simultaneously a part of the contact 20 is exposed.

At this time, the exposed portion of contact 20 is severely damaged during the dry etching process for patterning the upper interconnect layer 22a. When a stripping process is then performed to remove the photoresist pattern 34, a part or all of the tungsten contact 20 is also removed as shown in FIG. 4B.

Consequently, a complete tungsten plug does not exist in the via hole H1, or so that a complete electrical contact is not formed between the lower and upper interconnect layers 12 and 22a.

If contact 20 is damaged as described, the semiconductor device will likely operate as designed and the process yield is significantly decreased.

SUMMARY OF THE INVENTION

To solve the above problems, it is an object of the present invention to provide a photoresist pre-strip treatment solution which can prevent an exposed metal contact from being damaged during stripping of a photoresist after dry etching a metal interconnect layer.

It is another object of the present invention to provide a method of removing a photoresist by which an exposed metal at a via is protected.

It is still another objective of the present invention to provide a method of fabricating a semiconductor device, by which metal interconnects can be effectively and reliably connected to each other.

Accordingly, to achieve the first objective, a pre-stripping treatment solution is provided in which an organic acid solution having a carboxyl group is mixed with deionized water at a volume ratio of 1:0 to 1:100. Preferably, in the photoresist pre-strip treatment solution, the organic acid solution and the deionized water are mixed at a volume ratio of between 1:5 and 1:20.

The organic acid solution is a solution selected from the group consisting of an acetic acid solution and a citric acid solution. The acetic acid solution contains acetic acid of 50 to 99.9% by weight.

To achieve the second objective, there is provided a method of removing a photoresist used as a dry etch mask. In this method, the photoresist is ashed. The resultant structure is treated with a pre-stripping treatment solution as described above. The photoresist is then stripped using a cleaning solution according to known methods.

To achieve the third objective, a method of manufacturing a semiconductor device is provided. In this method, a first conductive layer of a metal such as Al, Cu, Pt or metal alloys is formed on a semiconductor substrate. An interlayer insulating film is then formed over the first conductive layer. The interlayer insulating film is patterned with a photoresist, and then dry etched to form a hole and expose the first conductive layer. The photoresist pattern is ashed. The resultant structure is treated using a pre-stripping treatment solution as described above. The photoresist pattern is then stripped using well-known cleaning solutions.

After the photoresist pattern has been stripped, a contact plug is formed by filling the hole with a metal such as tungsten or metal silicide. A second conductive layer covering the upper surfaces of the interlayer insulating film and the contact plug is then formed of aluminum, copper, platinum or metal alloys. The second conductive layer is patterned with photoresist, and dry etched to form a second patterned conductive layer. The second photoresist pattern is ashed. The resultant structure is treated with a pre-stripping treatment solution as described above. The second photoresist pattern is stripped by well-known methods. According to the present invention, the metal contact can be protected during stripping of the photoresist material.

BRIEF DESCRIPTION OF THE DRAWINGS

The above objectives and advantages of the present invention will become more apparent in the following description of a preferred embodiments which will proceed with reference to the attached drawings in which.

DESCRIPTION OF THE PREFERRED EMBODIMENTS

Figure 5:
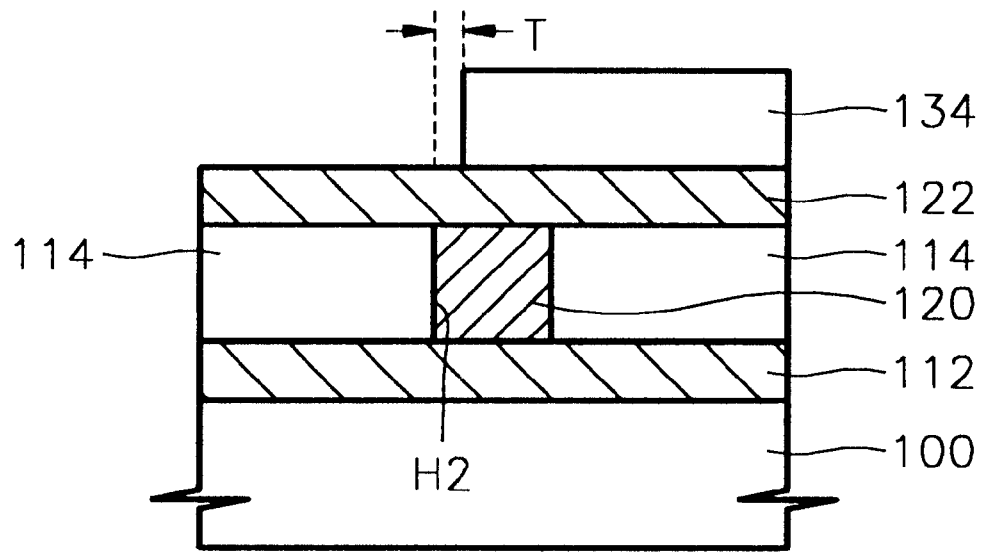
FIGS. 5 through 8 are cross-sectional views illustrating a method of removing a photoresist, according to a preferred embodiment of the present invention.

Preferred embodiments of the invention will now be described with reference to FIGS. 5 through 8. Turning to FIG. 5, a first patterned metal layer 112 is formed on a semiconductor substrate 100. The first metal layer 112 may then be patterned to provide, for example, an interconnect layer, a bit line or a local interconnection on the semiconductor substrate 100. The first metal layer 112 can be formed of aluminum, copper, platinum, another suitable metal or metal alloys. An insulating layer 114 such as $SiO_2$ is then deposited atop metal layer 112. Using known photolithographic processes, a hole H2 is formed through insulating layer 114 to expose the first metal layer 112. Tungsten, copper or another suitable metal, is then deposited in hole H2 to form a contact plug 120. Contact plug 120 can alternatively be formed of a metal silicide, e.g., titanium silicide or cobalt silicide.

Figure 1:
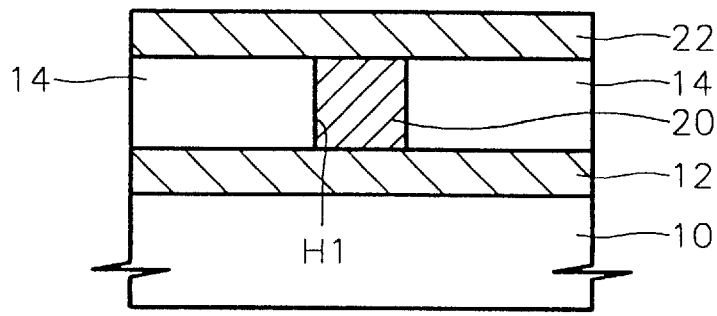
FIGS. 1 through 3 are cross-sectional views illustrating the steps for forming metal interconnects on a semiconductor substrate using a typical prior art method.
Figure 2:
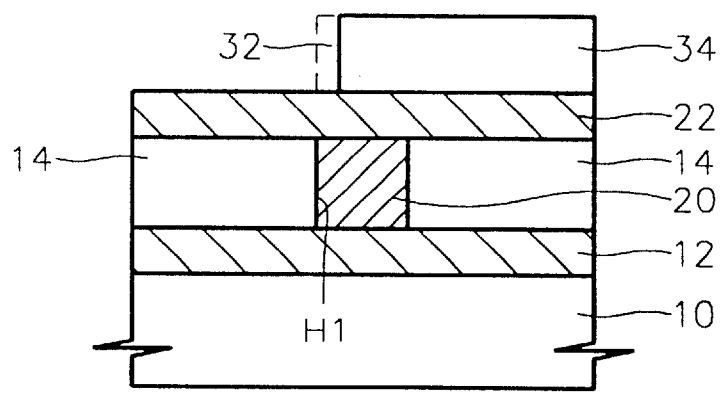
Figure 3:
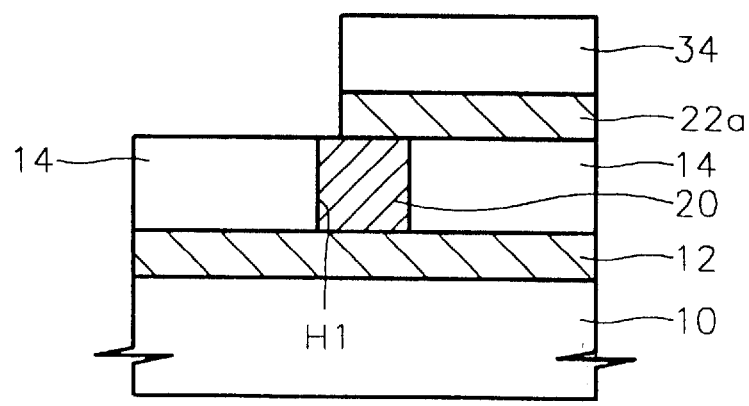
Figure 4A:
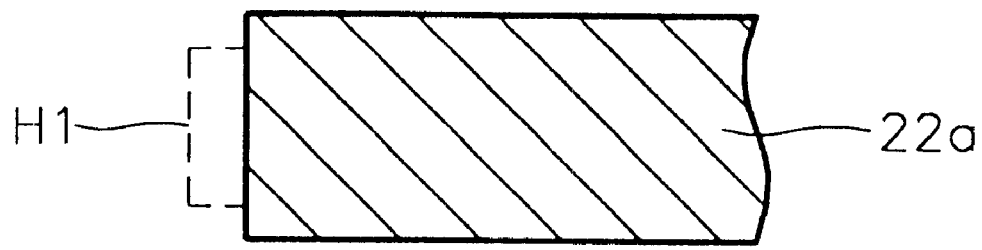
FIGS. 4A and 4B are a top view and a cross-sectional view, respectively, each illustrating a contact portion and a part of an upper interconnect layer after stripping a photoresist pattern using a typical method.
Figure 4B:
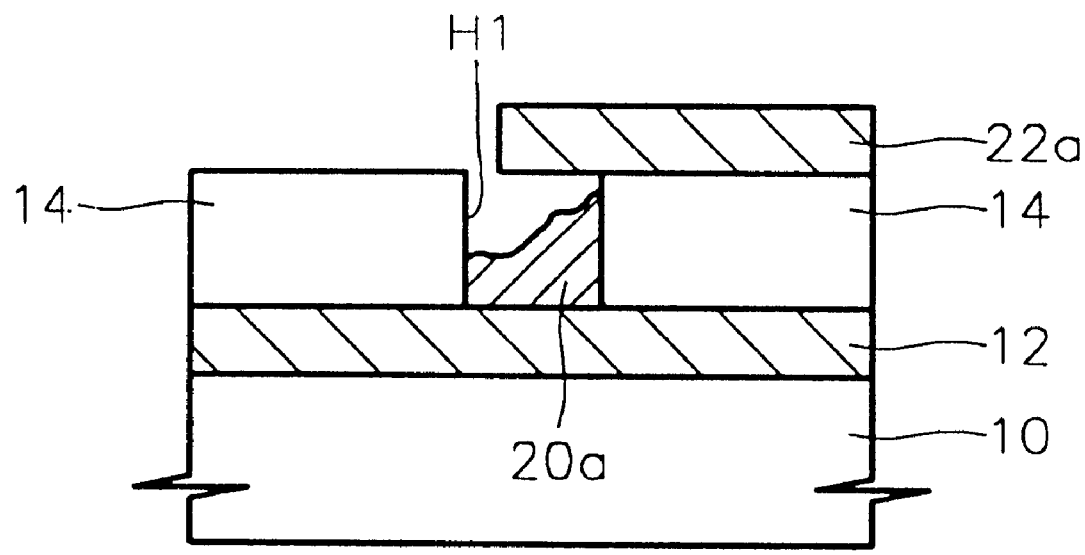
Figure 6:
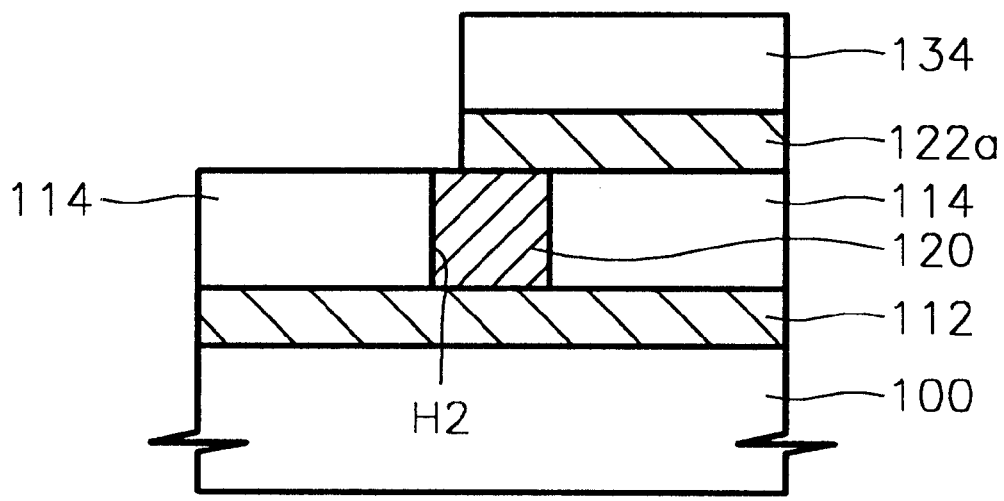
Figure 7:
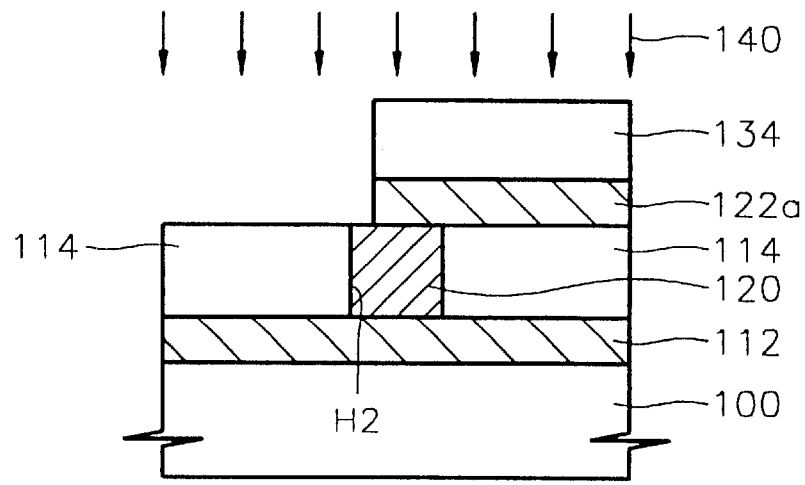

After planarization, a second metal layer 122 is then deposited over insulating lay 114 and contact plug 120. The second metal layer 122 is preferably formed of aluminum or aluminum alloys, although the invention is not limited thereto. A photoresist layer 134 is then applied in a predetermined pattern atop the metal layer 122 to form the desired conductive traces. FIG. 5 shows the photoresist pattern 134 misaligned to the contact plug as much as "T" width owing to a lack of an overlap margin as already described referring to FIG. 2. Referring to FIG. 6, the exposed portions of metal layer 122a are dry etched, but leaving a portion of the contact plug uncovered beneath the lay 134. As discussed above, if the layer 134 is then removed by dry etching according to prior art methods, contact plug 120 is likely to be damaged as shown in FIG. 4B. Applicant has discovered that damage to contact plug 120 can be avoided. The photoresist pattern 134 is ashed by exposing it to an $O_2$ gas at high temperatures. The resultant structure, including the ashed photoresist 134, is then treated using a liquid pre-stripping treatment solution 140. According to the invention, the pre-stripping treatment solution 140 is an aqueous organic acid, such as acetic acid, citric acid, or other organic acid having a carboxyl group, in deionized water at a volume ratio of 1:0 to 1:100, and preferably of 1:5 to 1:20. In the case of an acetic acid solution, the corresponding acetic acid content is between about 50 and 99.9% by weight. The pre-stripping treatment solution 140 is preferably applied at a temperature of from about 20 to 80° C., and more preferably between 45° C. and 55° C.

Figure 8:
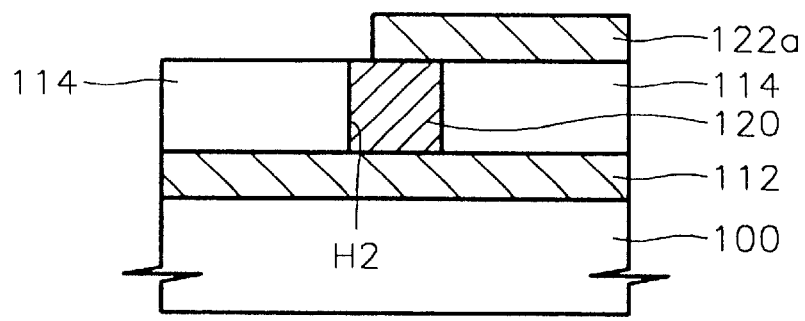
Figure 9:
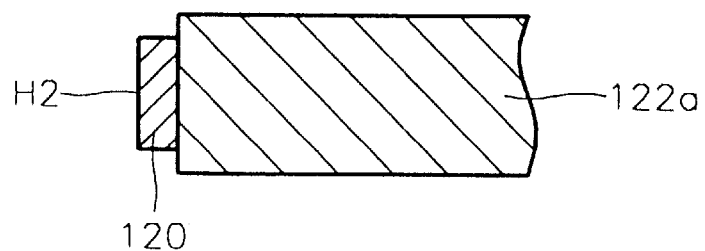
FIG. 9 is a top view illustrating a contact and a part of a conductive layer after stripping a photoresist pattern using a method according to the present invention.

Applicant has discovered that if a structure such as that shown in FIG. 6 is treated using the pre-stripping treatment solution 140 before stripping the photoresist pattern 134, the exposed surface of the plug contact 120 is not damaged. It is believed that the pre-stripping treatment as claimed herein passivates metal surfaces or causes a protective layer to be formed on the surfaces of the contact plug 120, as well as other exposed metal surfaces. Referring to FIG. 8, the pre-treated photoresist pattern 134 is then stripped using a cleaning solution such as ACT-CMI, ACT-935, EKC 245 or EKC 265. FIG. 9 is a partial top view of FIG. 8, i.e., a view illustrating the exposed portion of contact plug 120 and the second metal layer 122a after the photoresist pattern 134 has been stripped. Contact plug 120 is intact and in good electrical contact with both metal layers 112 and 122a.

However, the present invention is not limited to the above embodiment. For example, the pre-strip treatment solution according to the present invention can be adopted even before the stripping process for removing a photoresist pattern (not shown) used when patterning the interlayer insulating film 114, in order to cure the damage on a portion of the first metal layer 112 exposed via the hole H2 during the dry etch process for forming the hole H2, before forming the contact 120.

In other embodiments of the invention, the claimed method can be used generally to protect exposed metal layers or features during the removal of photoresist material by dry etching. Also, the present invention is not limited to the case in which a conductive layer is formed over a contact plug. For example, the present invention can be applied to the case in which a metal interconnect layer is formed over a conductive layer such as a bit line. That is, in any instance where a dry etch process for exposing the surface of the metal layer is performed using a photoresist pattern as a mask, the metal surface can be protected by being treated with the pre-stripping treatment solution according to the present invention before stripping of the photoresist pattern.

Although the present invention has been described with reference to the foregoing preferred embodiments, it is not limited thereto. It will be apparent to those of reasonable skill in the art that various modifications to the foregoing preferred embodiments can be made without departing from the spirit and scope of the following claims.

What is claimed is:

1. A method of manufacturing a semiconductor device, comprising the steps of:
   a) forming a first conductive layer comprising a metal on a semiconductor substrate;
   b) forming an interlayer insulating film on the first conductive layer;
   c) applying a first photoresist mask on the interlayer insulating film, the photoresist mask defining a hole;
   d) removing an exposed portion of the interlayer insulating film to form the hole exposing a part of the first conductive layer;
   e) ashing the first photoresist mask;
   f) forming a first protective layer on the first conductive layer by treating the resultant structure with a mixture consisting essentially of an organic acid having a carboxyl group and mixed with deionized water at a volume ratio of 1:0 to 1:100;
   g) after forming the first protective layer on the first conductive layer stripping the first photoresist mask;
   h) forming a contact plug by filling the hole with tungsten;
   i) forming a metal layer covering the upper surface of the interlayer insulating film and the contact plug;

j) dry etching the metal layer using a second photoresist pattern as a mask to form a second conductive layer;

k) ashing the second photoresist pattern;

l) forming a second protecting layer on the contact plug and the second conductive layer by treating the resultant structure of the step (k) with a mixture consisting essentially of an organic acid having a carboxyl group and mixed with deionized water at a volume ratio of 1:0 to 1:100; and m) after forming the second protective layer on the contact plug and the second conductive layer stripping the second photoresist pattern.

2. The method of manufacturing a semiconductor device as claimed in claim 1, wherein the first conductive layer is formed of at least one metal selected from the group consisting of aluminum, copper and platinum.

3. The method of manufacturing a semiconductor device as claimed in claim 1, wherein the organic acid solution is selected from the group consisting of an acetic acid solution and citric acid solution.

4. The method of manufacturing a semiconductor device as claimed in claim 1, wherein the organic acid solution is an acetic acid solution, and the acetic acid solution contains 50 to 99.9% by weight acetic acid.

5. The method of manufacturing a semiconductor device as claimed in claim 1, wherein the organic acid solution and the deionized water are mixed at a volume ratio of between 1:5 and 1:20.

6. The method of manufacturing a semiconductor device as claimed in claim 1, wherein the metal layer is formed of at least one metal selected from the group consisting of aluminum, copper, platinum and metal alloy.

* * * * *